US008664797B2

(12) United States Patent
de Waal et al.

(10) Patent No.: US 8,664,797 B2
(45) Date of Patent: Mar. 4, 2014

(54) PHOTOVOLTAIC ASSEMBLY AND METHOD OF OPERATING A PHOTOVOLTAIC ASSEMBLY

(75) Inventors: Klaas de Waal, Waalre (NL); Hendrik Johannes Bergveld, Eindhoven (NL); Henricus Cornelis Johannes Buthker, Mierlo (NL); Franciscus A. C. M. Schoofs, Valkenswaard (NL)

(73) Assignee: NXP B.V., Eindhoven (NL)

( * ) Notice: Subject to any disclaimer, the term of this patent is extended or adjusted under 35 U.S.C. 154(b) by 526 days.

(21) Appl. No.: 12/904,956

(22) Filed: Oct. 14, 2010

(65) Prior Publication Data
US 2011/0115297 A1 May 19, 2011

(30) Foreign Application Priority Data

Oct. 15, 2009 (EP) .................................... 09173139

(51) Int. Cl.
*H02J 1/00* (2006.01)
*H02J 3/00* (2006.01)
*H02J 7/00* (2006.01)

(52) U.S. Cl.
USPC ............................................ 307/77; 320/118

(58) Field of Classification Search
None
See application file for complete search history.

(56) References Cited

U.S. PATENT DOCUMENTS

| 2005/0077879 A1 | 4/2005 | Near |
| 2007/0063670 A1 | 3/2007 | Taurand |
| 2008/0116850 A1 * | 5/2008 | Konishi et al. ................. 320/118 |
| 2010/0133911 A1 * | 6/2010 | Williams et al. ................. 307/82 |
| 2010/0289338 A1 * | 11/2010 | Stauth et al. ..................... 307/77 |

FOREIGN PATENT DOCUMENTS

| DE | 102 19 956 A1 | 4/2003 |
| EP | 1 933 443 A1 | 6/2008 |
| WO | 2005122359 A2 | 12/2005 |
| WO | WO2005122359 | 12/2005 |

OTHER PUBLICATIONS

Extended European Search Report for Patent Appln. No. 09173139.8 (Apr. 21, 2010).

* cited by examiner

*Primary Examiner* — Jared Fureman
*Assistant Examiner* — Aqeel Bukhari

(57) ABSTRACT

A photovoltaic assembly is disclosed which comprises a string formed from a plurality of series-connected photovoltaic generators, and a hierarchical structure of power-exchange units, which each exchange power between neighboring photovoltaic generators or groups of photovoltaic generators. The photovoltaic generators may be individual solar cells or a plurality of series-connected solar cells arranged as a segment. To compensate for differences in output between segments for instance due to partial shading, power-exchange units, such as DC-DC converters, are arranged across neighboring segments, such that each power-exchange unit effectively sources or sinks current between neighboring segments to current-match the string. To avoid unnecessary "rippling" of power matching along many power-exchange units and the associated power loss due to many power-exchange units operating at less than 100% efficiency, the power-exchange units are arranged in a hierarchical structure. A method of operating such a photovoltaic assembly is also disclosed.

7 Claims, 14 Drawing Sheets

PHOTOVOLTAIC ASSEMBLY AND METHOD OF OPERATING A PHOTOVOLTAIC ASSEMBLY

This application claims the priority under 35 U.S.C. §119 of European patent application no. 09173139.8, filed on Oct. 15, 2009, the contents of which are incorporated by reference herein.

FIELD OF THE INVENTION

This invention relates to photovoltaic assemblies. Moreover, it further relates to methods of operating photovoltaic assemblies.

BACKGROUND OF THE INVENTION

Photovoltaic systems or assemblies for terrestrial use typically comprise one or more photovoltaic panels, which are also commonly known as solar panels or solar modules, and which are connected in series in order to generate a desired voltage which may be, for instance, suitable for DC-AC conversion to a mains voltage. This series arrangement may be referred to as a string. In some applications, where the surface area to be covered with panels or modules is sufficiently large, further series arrangements or strings are connected in parallel, thereby increasing the overall current and power output without the requirement to operate at an overly high voltage.

A typical solar module comprises many individual solar cells, connected in series. The solar cells are grouped in segments, which are commonly also known as sub-strings. A typical solar module may thus comprise, say 60 series-connected solar cells, arranged as three series-connected segments of 20 solar cells each. Across each segment is normally provided a bypass diode.

As will be familiar to the skilled person, in circumstances such that the photo-generated current from one solar cell in a segment is less than that produced by the remainder of the segment, which may occur for instance when a cell is shaded or debris is present on top of a cell, under normal operation either the series connection between the cells forces the low output cell into reverse bias, to a point where the cell starts breakdown and passes the same current as remainder of the string, or (for instance in the case that further series-connected segments force the higher current through the segment) to a point where reverse voltage across the low output cell balances that across the remainder of the segment, in which case the string current flows through the bypass diode, and the segment does not contribute power, but rather consumes power by virtue of the power loss in the bypass diode.

The present Applicant's un-published International Patent Application PCT2009/IB053001 discusses the use of an energy exchange unit to compensate for the lower current output from the partially shaded cell (or cells). In embodiments, the energy exchange unit is a DC-DC converter. Further, present Applicant's un-published European Patent Application 09166852.5 discusses an arrangement where the energy exchange unit is powered solely from the affected and nearest-neighbour segments.

SUMMARY OF THE INVENTION

The present invention has been found useful in reducing the power lost to a photovoltaic assembly, due to mismatches in current flow from different segments in a series-connected string. Further, the present invention provides a low-loss method of operating a photovoltaic assembly.

According to the present invention, there is provided a photovoltaic assembly comprising a plurality of sub-assemblies arranged as a hierarchical tree structure of leaf-nodes and branch-nodes, each sub-assembly comprising a plurality of series-connected sub-units, and a power-exchange unit connected across each pair of neighbouring sub-units and connected to a node therebetween; wherein at each leaf-node each sub-unit comprises a photovoltaic generator, and at each branch-node at least one sub-unit comprises a further said sub-assembly. With such a hierarchical array of power exchange units it need not be necessary to operate every power exchange unit, in order to compensate for mismatched currents. Rather, one or more of the power exchange units may be non-operational, or switched off, and the power losses associated with operating such unit or units may be thereby avoided.

In embodiments at each branch-node each sub-unit comprises a further said sub-assembly. With such an arrangement each of the photovoltaic generators are associated with a first-level power-exchange unit, as none of the higher level power exchange units directly source or sink power from a photovoltaic generator In embodiments the photovoltaic generator comprises a plurality of series-connected solar cells. Alternatively and without limitation, the photovoltaic generator may be a single solar cell, or a plurality of parallel-connected solar cells.

In embodiments, the power-exchange unit is configured to at least one of source current to and sink current from the said node. In preferred embodiments, the power exchange unit is configured to maintain a control voltage within a pre-determined voltage window centred around the mid-point of the voltage across the pair of neighbouring sub-units. Such a predetermined voltage window allows, inter alia, for some manufacturing tolerance or temperature difference between the solar cells or groups of solar cells.

Preferably the power-exchange unit is configured to be operable only when the control voltage is not within the predetermined voltage window. Thereby, in use, it may be possible to disable or switch off one or more of the power-exchange units, thereby avoiding power losses associated with less than 100% efficient operation of the power-exchange units, and providing a power saving to the photovoltaic assembly.

In embodiments, the said control voltage is a voltage at the node, off-set by a voltage which is dependent on a current through the node. It can thereby be avoided that the power exchange unit bounces between an on-state whilst the control is outside of the voltage window, and an off-state once the control brings operation to within the voltage window. The configuration still allows the power-exchange unit to be inoperable and thus consume no or negligible power, where appropriate.

In embodiments the power-exchange unit comprises at least part of a DC-DC converter. The DC-DC converter may comprise two series-connected switches connected between the respective pair of sub-units and having a half-bridge node therebetween, and an inductor connected between the half-bridge node and the node between the respective pair of sub-units. Such a DC-DC converter represents a particularly convenient form of a power-exchange unit, and requires few expensive components and consumes little energy.

According to another aspect of the present invention there is provided a photovoltaic assembly comprising: a first sub-unit, a second sub-unit connected in series with the first sub-unit, and a power-exchange unit connected across the first and second sub-units and further connected to a node therebetween; at least a one of the first sub-unit and the second sub-unit comprising: at least two photo-generators, and a power-exchange unit connected across two neighbouring photo-generators and further connected to a photogenerator node therebetween; each photogenerator comprising a solar cell or a plurality of series-connected solar cells.

According to a yet further aspect of the present invention there is provided a method of operating a photovoltaic assembly comprising a plurality of series-connected photovoltaic generator units, the method including using at least one DC-DC converter to exchange power within a group of neighbouring photovoltaic generators to balance the currents supplied by the neighbouring photovoltaic units, and using at least one further DC-DC converter to exchange power between said group and a further photovoltaic generator unit, wherein each photovoltaic generator comprises a solar cell or a plurality of series-connected solar cells, and the further photovoltaic generator unit comprises a photovoltaic generator.

Preferably the further photovoltaic generator unit comprises a DC-DC converter configured to exchange power within a group of neighbouring photovoltaic generators.

These and other aspects of the invention will be apparent from, and elucidated with reference to, the embodiments described hereinafter.

BRIEF DESCRIPTION OF THE DRAWINGS

Embodiments of the invention will be described, by way of example only, with reference to the drawings, in which.

Figure 1:
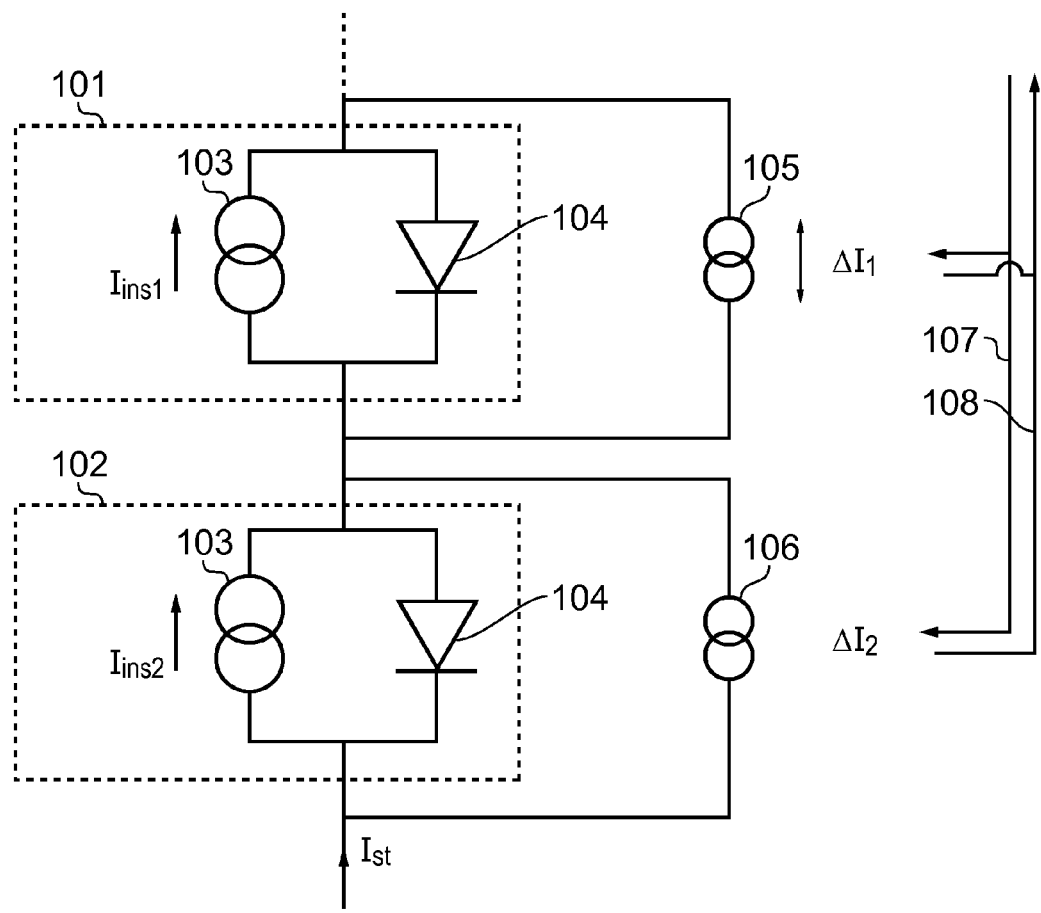
FIG. 1 shows the electrical circuit of two series-connected solar cells together with parallel current generators.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments.

DETAILED DESCRIPTION OF EMBODIMENTS

The basic concept of a delta converter may be explained with reference to FIG. 1. FIG. 1 shows, in schematic form, the electrical circuit equivalent to two series-connected solar cells 101 and 102 respectively. Considering the so-called single-diode model of a solar cell, and ignoring shunt and series resistances, the cell may be modelled by a photo-current generator 103 in parallel with a diode 104. To a first approximation, the photo-current, or insolation current, generated by the photo-current generator 103 is proportional to the optical flux incident on the cell. Where one cell is in relative shadow, or there is debris on the cell, or for some other reason there is a lower optical flux on that cell, it may produce a lower photocurrent, such that the photocurrent $I_{ins2}$ produced by the second cell 102 may be lower than the photo-current $I_{ins1}$ produced by the first cell 101. The cell current output from each cell is the difference between the photo-generated current ($I_{ins1}$ and $I_{ins2}$ respectively) and the diode current through the parallel diode 104.

Since the two cells are series-connected, Kirchoff's law dictates that the cell current through them must be the same. Thus the voltages across the cell will adjust such that the diode current accommodates the difference. The energy, or power consumed by the diode is lost to the system as heat.

As claimed in present Applicant's International Patent Application PCT2009/IB053001, and shown in FIG. 1, it is possible to compensate for the differences between $I_{ins1}$ and $I_{ins2}$, by inclusion of a further current generator (which may be either a current source or sink) placed in parallel with each diode. As shown, current sink 105 is connected in parallel with the first cell 101 and sinks the current $\Delta I1$, and current source 106 is connected in parallel with the second cell 102 and sources a current $\Delta I2$. The power requirements, 107 and 108, for the current generators, may be provided from the string voltage. In the illustrated example shown, the current $\Delta I1$ sunk by current sink 105 is equal to the difference between $I_{ins1}$ and the string current $I_{st}$; similarly the current sourced by current source 106 is equal to the difference between the current $I_{ins2}$ and $I_{st}$. As will be described in more detail below, the current generators may be implemented particularly conveniently as DC-DC converters. Furthermore since the converters are only required to convert the difference between the currents in the two cells, they may be termed "delta converters".

Figure 2:
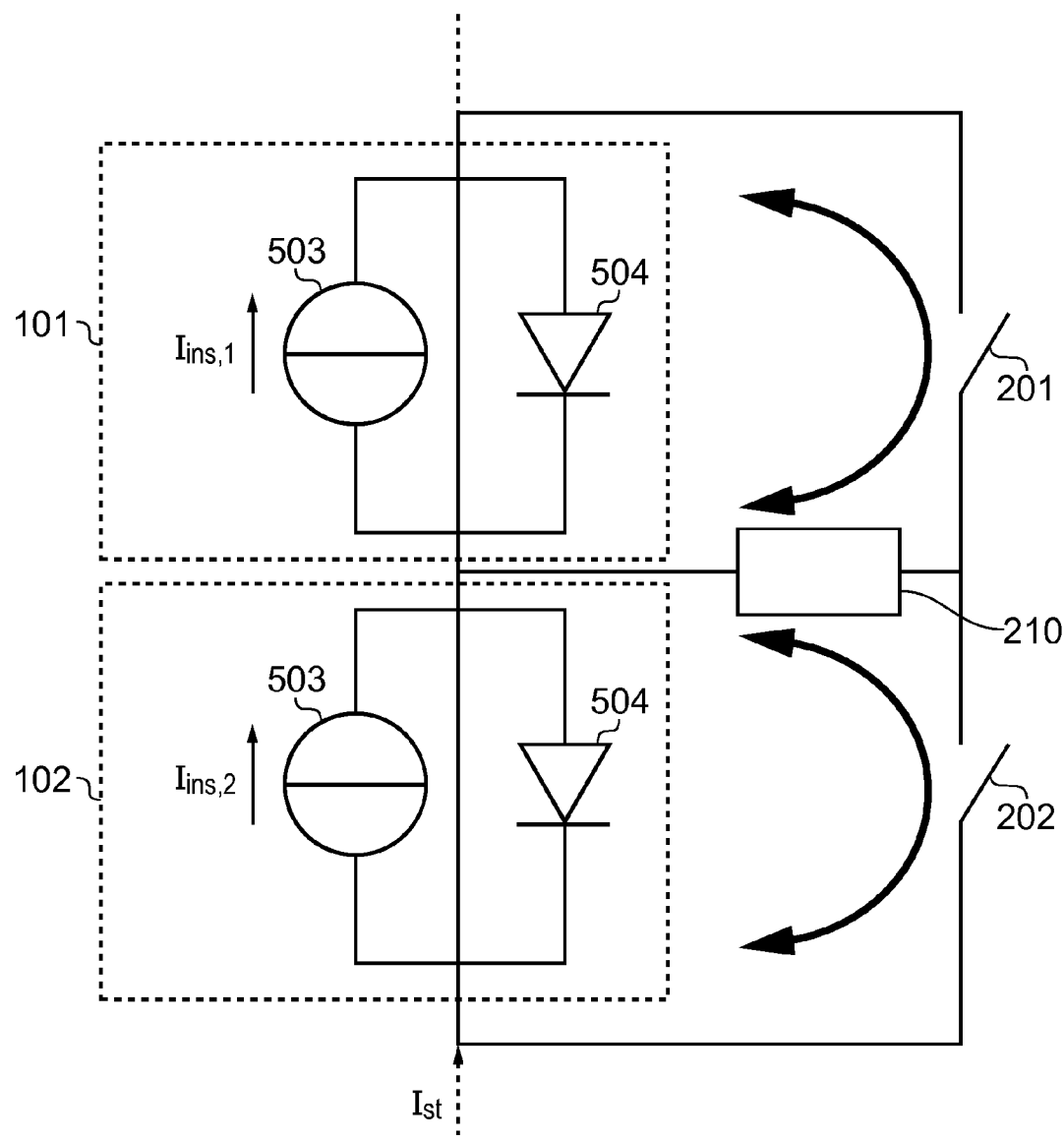
FIG. 2 shows a schematic of series-connected two solar cells with an energy exchange unit therebetween.

Furthermore, as discussed in present Applicant's European Patent Application 09166852.5, it is possible to supply the power for the delta converter from the solar cells themselves. This is illustrated schematically in FIG. 2. The arrangement shown in FIG. 2 is similar to that of FIG. 1; however, instead of separate current generators 105 and 106 in parallel with the first and second cell respectively, in this case a single energy-storage unit 107 is switchably connected between the two cells. The energy-storage unit 107 is arranged to be alternately connected, by means of switch 201 across the first cell 101, and then by means of switch 202 across second cell 102. As a result the energy-storage unit can be used to "shuttle" energy between the two cells. The result is that the unit acts to, effectively, source power to the cell with lower photo-generated current and sink power from the cell with the higher photo-generated current. Thus in this example, the energy-storage unit provides for an exchange of power between two neighbouring cells. Once more a particularly convenient implementation is by means of a DC-DC converter.

Figure 3:
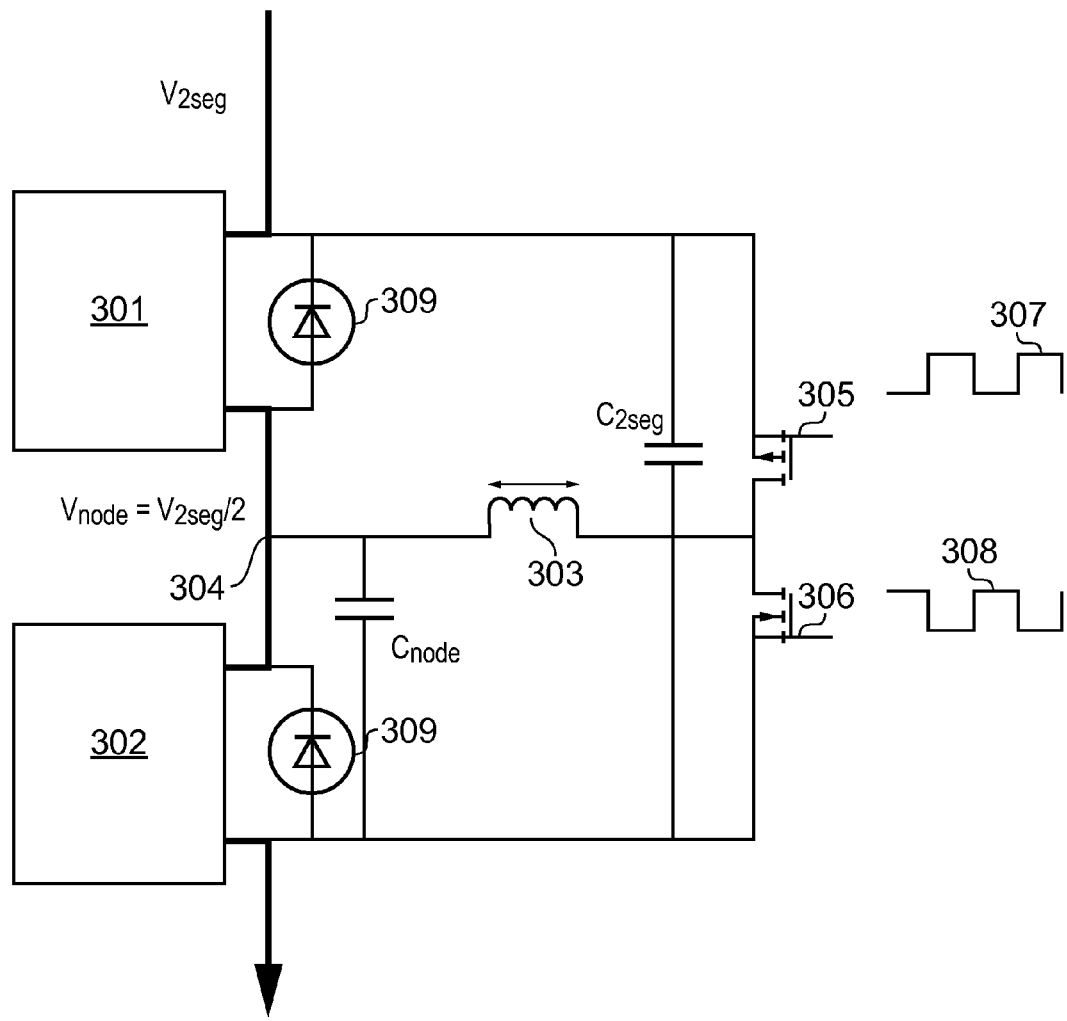
FIG. 3 is a schematic of an energy-exchange unit connected between two photovoltaic segments.

The electrical circuit of such a DC-DC converter operating as a power-exchange unit is illustrated in FIG. 3. In FIG. 3 is shown two segments 301 and 302, each comprising a series arrangement of a plurality of solar cells, and connected in series with a node 304 therebetween. In parallel with each segment is a respective bypass diode 309. A capacitor $C_{node}$ is connected across the lower segment 302, and a further capacitor $C_{2seg}$ connected across both segments. An energy-storage unit, in this case implemented as an inductor 303, is connected between the node 304 and the half-bridge node between two switches 305 and 306. In operation, the switches are driven by out-of-phase driving pulses, 307 and 308 respectively. By appropriate timing of the driving pulses 307 and 308, the DC-DC converter acts to stabilise the voltage $V_{node}$ of the mid-node 304 to be the midpoint of the voltage V2seg across the pair of segments. Thus, $V_{node}=V_{2seg}/2$. It can readily be shown that, in circumstances where the photo-generated current from one, or part of one, of the segments 301 or 302 is different to that from the other segment, the DC-DC converter acts to supplement and subtract from the respective currents, such that the current through the string is balanced.

At this point it should be noted that the terminology "energy exchange" and "power exchange", is used interchangeably herein; since we are concerned with steady-state conditions rather than transient, the power is simply energy per unit time.

Implementation of such energy-exchange units between neighbouring segments can limit the excess power lost to the photovoltaic assembly viewed as a whole, which excess power loss could otherwise arise when a segment or part of a segment is in relative shadow. Absent such exchange units, the current from a partially shallow segments, can in the some cases dominate the string current such that power is lost to the system equal to:

(current difference)×(string voltage−segment voltage)

where 'current difference' is the difference between the fully illuminated segments' photocurrent and the partially shaded segment's photocurrent, and ('string voltage−segment voltage') is the voltage across the remaining (fully illuminated) segments. Alternatively, the partially shadowed segment may be bypassed by the bypass diode and thus not contribute to the photovoltaic assembly's power at all, representing a similarly 'unnecessary' loss to the overall system of:

(shadow current)×(segment voltage), where 'shadow current' is the generated currents in the partially shadowed segment.

In circumstances where there is partial shading to the end segment of a string with many segments, use of delta converters between each pair of neighbouring segments can result in all of the delta converters operating, in order to supplement the current of the end segment, and reduce the current of each of the other segments of the string. Since each delta converter is not 100% efficient, there is an associated power loss through the use of converters, and where there are many converters, the loss could be significant. This is a non-ideal situation, which is further elucidated with reference to FIG. 4.

Figure 4:
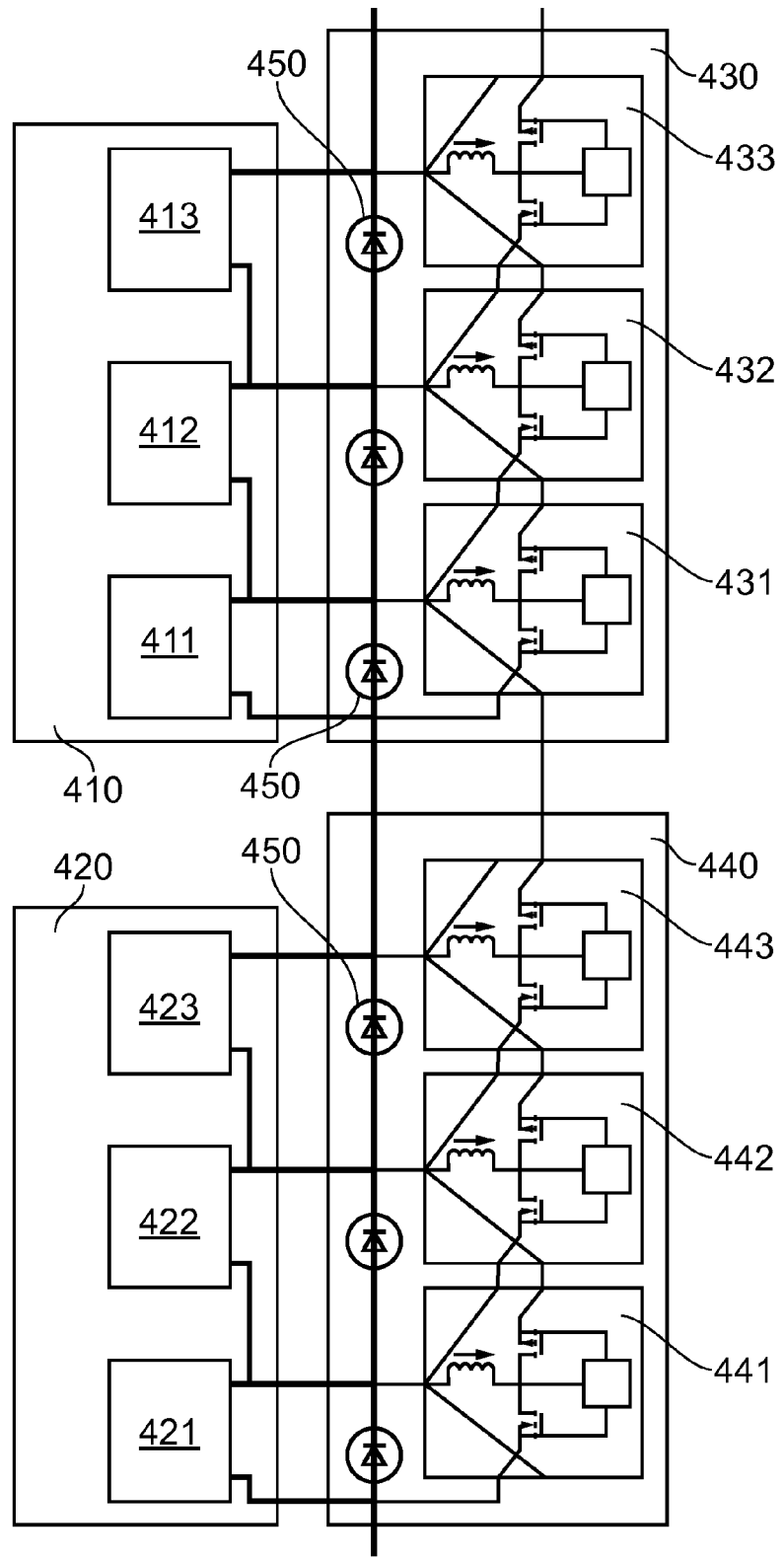
FIG. 4 shows a schematic of two photovoltaic modules with delta converters connecting the segments and the modules.

FIG. 4 shows two PV (photovoltaic) modules 410 and 420 connected in series. Each PV module comprises three segments, 411, 412 and 413, and 421, 422, and 423 respectively. Each segment has a bypass diode 450. Each PV module is also associated with a junction box 430 and 440 respectively, which houses three DC-DC converters, 431, 432 and 433, and 441, 442 and 443 respectively. Converters 431, 432, 441 and 442, act as energy-exchange units between neighbouring segments within the respective modules, viz: converter 431 provides an energy-exchange mechanism between segments 411 and 412, converter 432 provides an energy-exchange mechanism between segments 412 and 413, and so on. The respective "end" converters in each junction box provide energy exchange between the top segment of that junction box, and the next PV module. Thus the DC-DC converter 443 provides energy exchange between segment 423 of PV module 420 and PV module 410.

The energy exchange is achieved based on the voltage equalisation of the two segments across which each delta converter is connected. In this way, energy can effectively be exchanged between all segments in the string. The exchange of energy between modules by means of a third converter in each junction box is needed in many shading conditions, because without such "through" connection between modules, problems could arise. For example, when one module is partly shaded and the other modules are in full sunlight, the delta converters in the partly shaded module will control the current of the partly shaded module to the average current available in the module. However, were no energy exchange with the other modules possible, and this module's average current lower than the maximum power point (MPP) current of the other modules in the string, the complete module would be bypassed and the delta converters would be ineffective. Therefore, the third delta converter in each junction box (respectively 433 and 443,) is required to exchange energy with the next module, and to ensure that the string current becomes the "average" current value for the complete string. Bypass of any module is thus prevented and the maximum available power output power should be guaranteed.

Thus by including the third energy converter 443, the current balancing can thus occur not only within the individual PV module, but in the segments of the neighbouring module as well. In effect, the energy exchange can "ripple" all the way through to the partially shaded segment 421 from the top segment 413. All the delta converters are then active, and the energy rippling from the top of the string to the bottom is effected by the efficiency of every one of the delta converters. For long strings, the energy loss associated with rippling energy through all the active delta converters can significantly impact the efficiency of system and the output power with the delta converters operational may become lower than that which would result without using delta converters at all! This is particularly the case where in the energy which can be regained is small, for example from a relatively small shaded area, or where the shaded area is only weakly illuminated so produces only a small amount of energy in the first place, which could be reclaimed.

It is possible to use a "voltage window" such that the delta converter only becomes active when the mismatch between segment voltages (indicative of their maximum-power-point-currents) falls outside the voltage window. In the case that the voltage window is used, a delta converter further up the chain will only become active if its bottom segment voltage decreases below the lowest voltage window limit in the case described above. This would result in a reduction in the number of active converters, but at the expense of the less ideal energy conversion in each case. However, in the case of deep shading, all of the delta converters are still likely to be operational, since it will be necessary to transfer a significant amount of energy towards the deeply shaded segment.

In some embodiments, the "voltage window", is constructed using 3 resistors in series between the total voltage of 2 segments (for example), of 100 kΩ 10 kΩ and 100 kΩ The window voltage is now present on either terminal of the 10 kOhm resistor. The measured center-tap voltage Vcen, minus I*Rsense*gain, is then compared with the two window voltages. So, in case the converter has to deliver more current, the resulting voltage Vcen−I*Rsense*gain is further away from the window voltages and the converter remains on. When the current to equalize the two segments drops to a certain level where Vcen−I*Rsense*gain=Vwindow, then the converter switches off, after which the current I becomes zero, after which Vcen may fall outside the window again, etc. Then the converter operates in burst mode until the current to equalize the two entities is sufficiently low that the converter remains off, since Vcen falls within the window.

Figure 5:
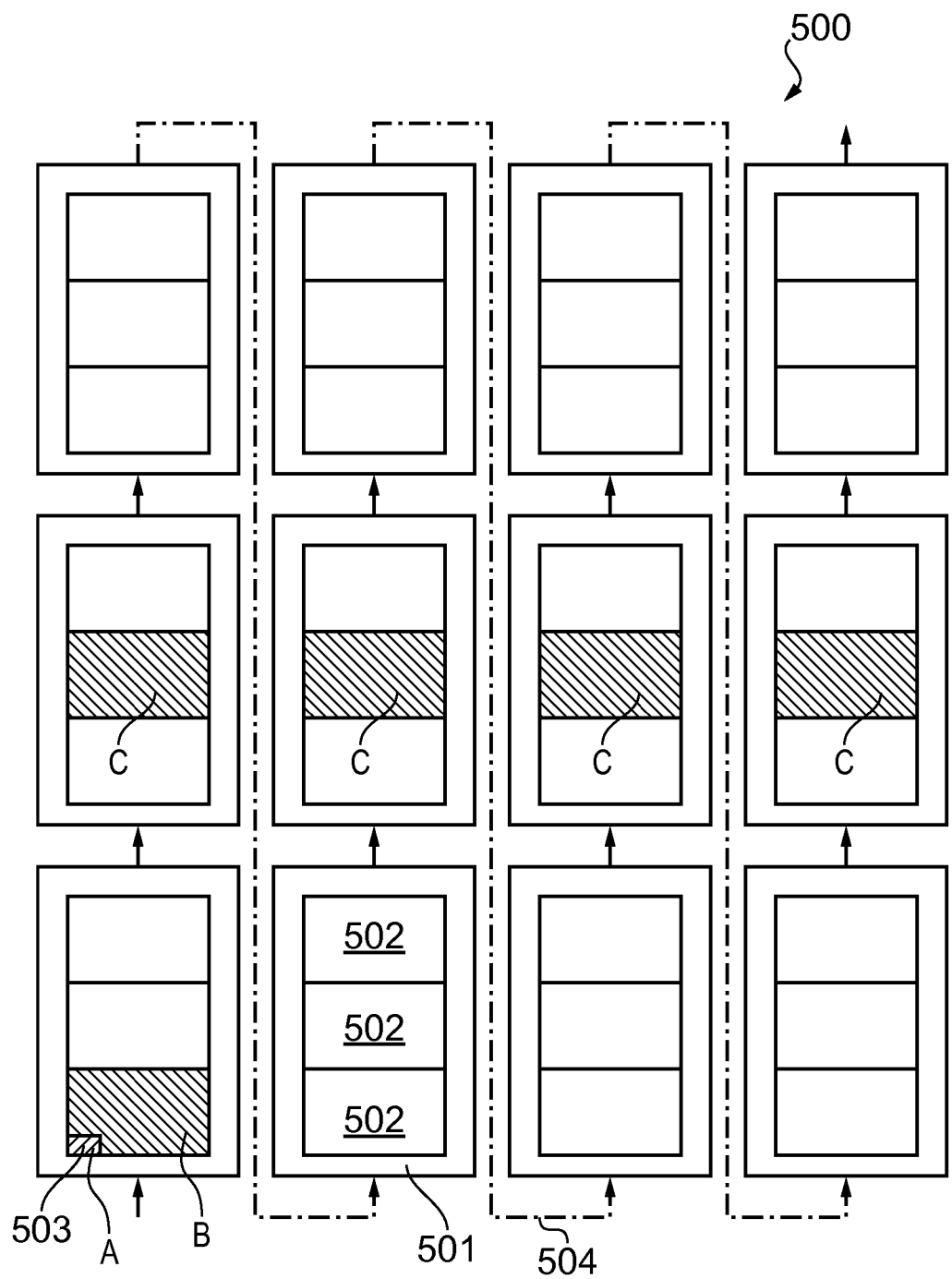
FIG. 5 shows a schematic of a photovoltaic assembly having 12 series-connected solar panels arranged in a 4×3 grid.

The effect of the losses due to rippling has been simulated for a string having 12 series-connected modules, each with 3 segments and 20 cells per segment, and a bypass diode across the segment, as shown schematically in FIG. 5, with the modules 501 arranged in a 3 by 4 array and series-connected "up then right" as shown by wiring 504. Thus there is a total of 36 segments, and 35 delta converters (not shown) since the top segment does not require a delta converter. The delta converters are assumed to have a voltage window of 2.5%, and an efficiency of 95%.

Figure 6:
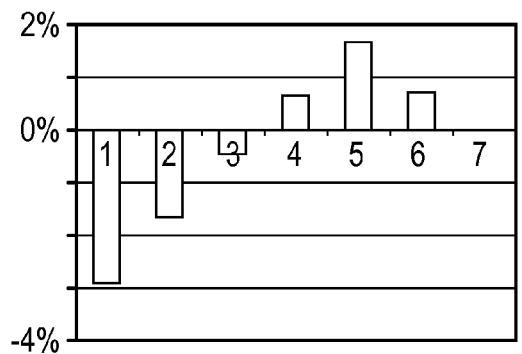
FIG. 6 is a graph of simulated relative output-power increase by using delta converters for the arrangement of FIG. 5 when one cell in one panel is in shadow.
Figure 7:
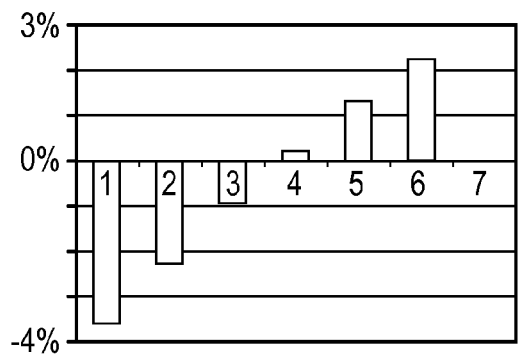
FIG. 7 is a graph of simulated relative output-power increase by using delta converters for the arrangement of FIG. 5 when one segment in one panel is in shadow.
Figure 8:
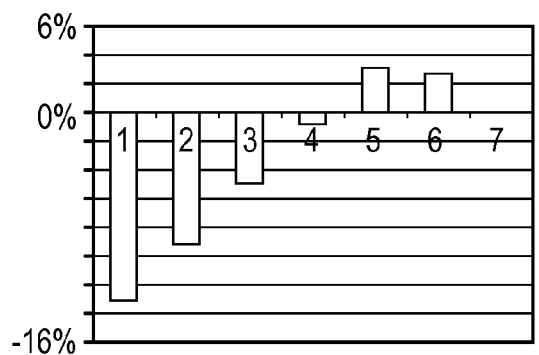
FIG. 8 is a graph of simulated relative output-power increase by using delta converters for the arrangement of FIG. 5 when one module is in shadow.

The relative output power increase by using delta converters (that is, relative to not using delta converters at all), for various shading conditions are shown in FIGS. 6, 7 and 8. In each figure is plotted the percentage increase (or decrease) in the output power for the various depths of shading, of a specific cell group of cells. For an average full illumination level of 7 (×100 W/m$^2$), the results of illumination levels at the shaded component of 1 (×100 W/m$^2$) (deep shade) through to 7 (×100 W/m$^2$) (no shading at all) are shown from left to right.

FIG. 6 shows the effect of the delta converters on the string of FIG. 5 when a single cell 503 on the bottom segment of the bottom left module is shaded (shown at A in FIG. 5). Although the delta converters provide an improvement for relatively light shading (400 to 600 W per meter squared), they show a net loss for deep shading, due to the operation of a high number of delta converters, each running at less than 100% efficiency.

FIG. 7 shows the effect of the delta converters on the string of FIG. 5 when the whole of the bottom segment of the bottom-left module is shaded (shown at B in FIG. 5). The delta converters again provide a positive effect under light shading, and a negative effect under deep shading, although in this case the effect is more pronounced.

FIG. 8 shows the effect of the delta converters on the string of FIG. 5 when the whole of the bottom-left module is shaded. The delta converters once again provide a positive effect under light shading, and a negative effect at deep shading, and in this case the effect is yet more pronounced. Again, this can be understood since the energy required by the bottom-left panel to balance the string has to "ripple" through a large number of energy converters, each of which introduced a 5% loss (of the rippled energy).

Figure 9:
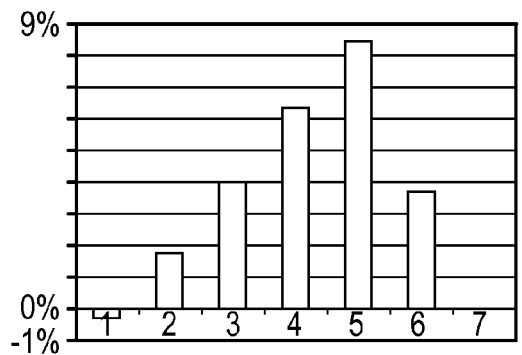
FIG. 9 is a graph of simulated relative output-power increase by using delta converters for the arrangement of FIG. 5 when several separate segments are in shadow.

Finally, FIG. 9 shows the effect of the delta converters on the string of FIG. 5, when a specific horizontal section, or stripe, across the string is shaded. As shown at C in FIG. 5, the whole of the middle segment for each of the second, fifth, eight, and the 11th module is in shadow. In this case, the delta converters provide a positive effect for all but the deepest shadow. This may be understood since energy is "rippled" through relatively fewer delta converters to compensate the shaded segments, as these segments are distributed along the string.

In order to overcome the above problem of energy "rippling" along many segments and incurring losses in many delta converters, it is possible to use a hierarchical topology, according to embodiments of the invention. This is illustrated in FIG. 10.

Figure 10A:
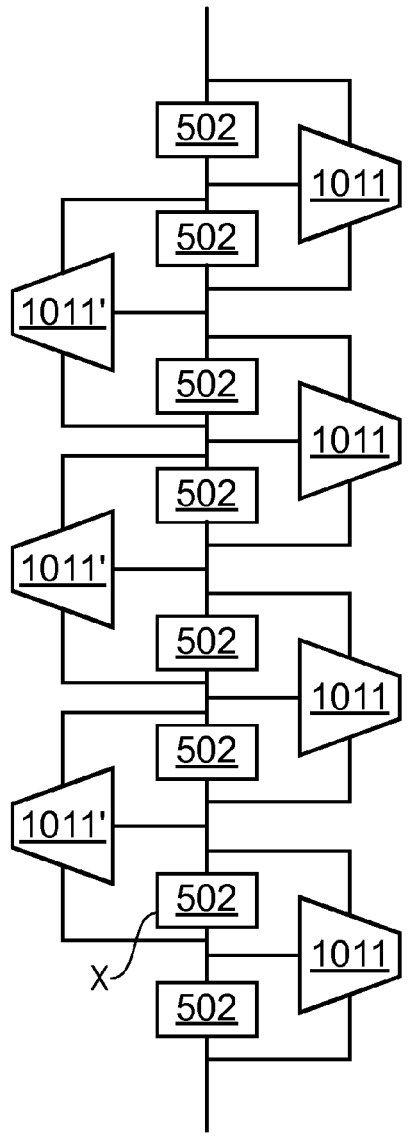
FIG. 10 shows two arrangements of delta converters with solar segments: at 10a arranged in a conventional way, and at 10b in a hierarchical arrangement according to an embodiment of the invention.

FIG. 10 shows, at FIG. 10a a conventional arrangement of delta converters between neighbouring segments 502. Energy exchange from each segment 502 is facilitated with its neighbouring segment in one direction, by the first delta converter 1011, and in the other direction by a second delta converter 1011'. (Of course, for the end segments, energy can be exchanged only in one direction). Thus, for example, segment X shown can exchange energy with the segment below it by means of delta converter 1011, and with the segment above it by means of delta converter 1011'.

Figure 10B:
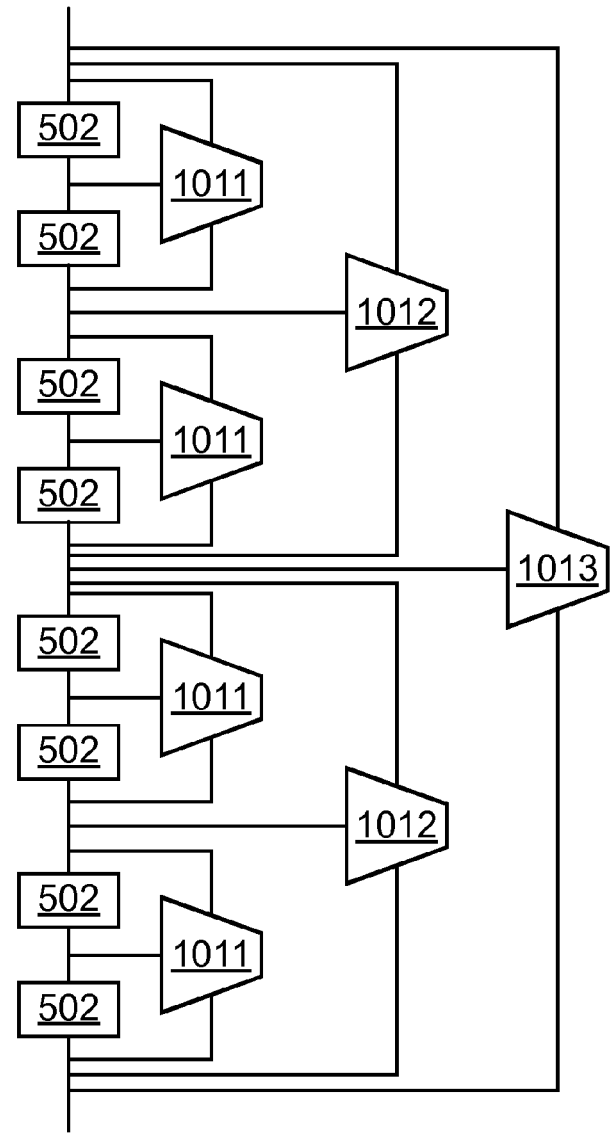

In contrast, FIG. 10b shows a hierarchical structure, in which energy exchange is facilitated between a pair of neighbouring segments by means of a first-level delta converter 1011; however, energy exchange is exchanged with the next pair of segments, by a higher-level delta converter 1012. Each higher-level delta converter 1012 facilitates exchange between two pairs of segments. As shown the concept is extended to a further, third level, delta converter 1013 which facilitates energy exchange between two groups each of four segments. It will be readily appreciated that the concept could be extended to yet higher levels with exchange between groups of 8, or 16, segments, and so on.

A characteristic of this arrangement is that the voltage equalisation on any "fine" level, that is on a single segment 502, is combined with voltage equalisation on a "coarse" level, that is from a group of segment to a neighbouring group of segments. It will be immediately apparent that by moving from a fine level to a coarse level and back again, energy may be exchanged between segments at remote ends of the string without passing through as many delta converters as is required in the conventional, non-hierarchical arrangement shown in FIG. 10a. It will also be apparent that the total number of delta converters is unaffected, although the wiring configuration is significantly modified.

Figure 11:
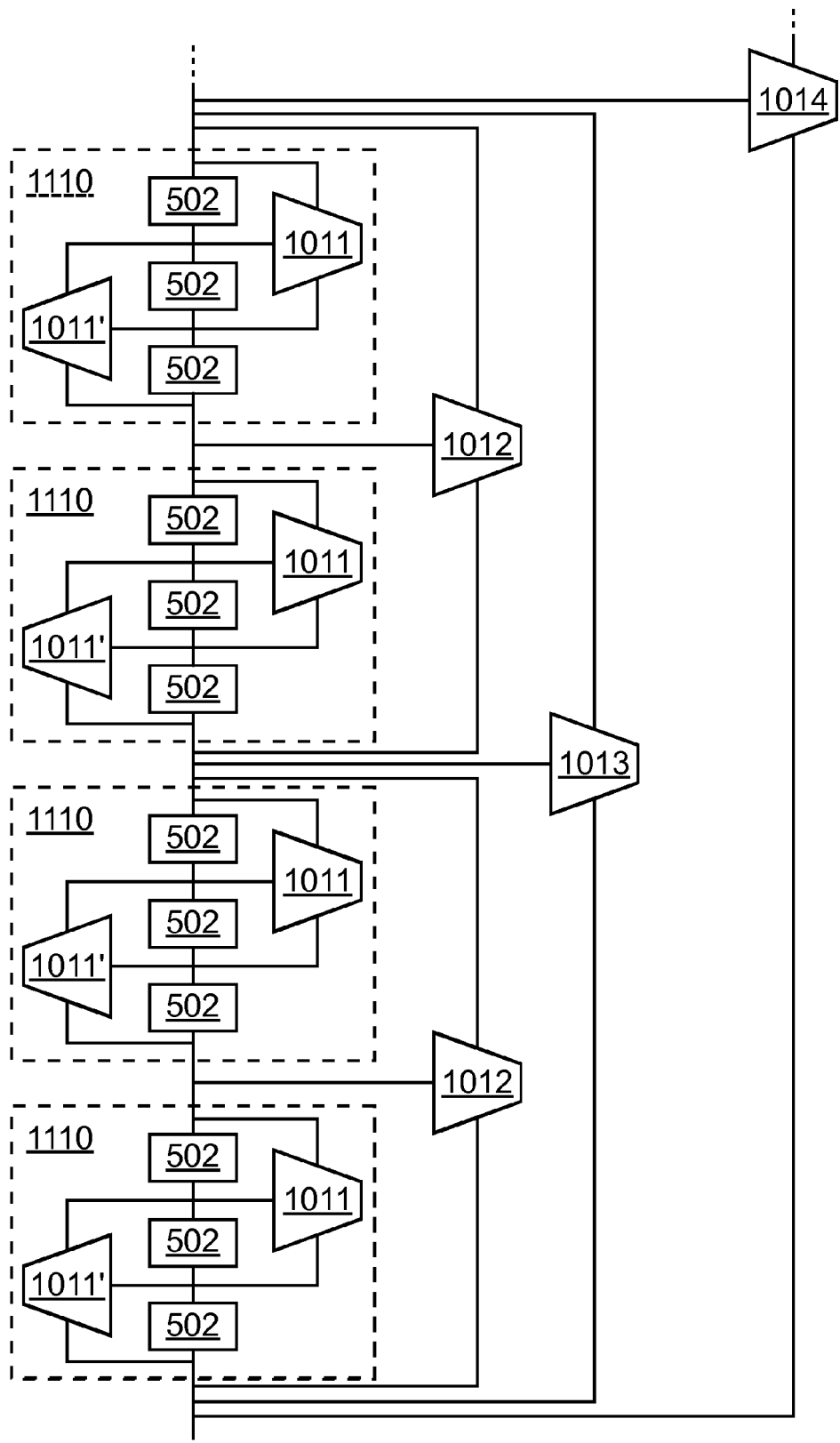
FIG. 11 shows a three-level hierarchical arrangement of delta converters for connecting four panels each with three segments.

The hierarchical arrangement shown in FIG. 10b is a simple binary arrangement; however, embodiments of the invention are not limited to binary arrangements, and FIG. 11 shows an example of an alternative arrangement. In this case there are 12 segments 502 arranged in 4 modules 1110. Within each module, energy exchange is facilitated between the bottom and middle segments by means of a first delta converter 1011', and energy exchange is facilitated between the middle and top segment by means of a second delta converter 1011. However, energy exchange is facilitated between the whole of the first module, and the second module taken as a whole, by means of a second level delta converter 1012. Thus, in this arrangement each second-level delta converter operates on three segments between each pair of terminals. As in FIG. 10b, a third-level delta converter operates between larger groups.

For each level in the hierarchy it is preferable that the number of elements (either number of solar cells within a segment, or number of segments—assuming each has the same number of solar cells) connected between the terminal of the delta converter is equal: otherwise control of the delta converter would be more complex, as the voltages would not be equal, and the converter would be required to operate at a duty cycle which is not 50%, as the person skilled in the art of DC-DC conversion will readily appreciate. Having equal numbers of elements facilitates 50% duty cycle operation, which is advantageous, inter alia, as it allows for simple ripple cancellation—by operating two half-bridges in anti-phase.

A convenient way of describing hierarchical structures is by means of hierarchical tree terminology. Using this terminology, with reference to FIG. 10b, each first-level converter which exchanges energy between two neighbouring segments (each of which could of course be an individual solar cell, but would more generally be a plurality of series-connected cells), is termed a leaf node, since it is the lowest-level node and there are no branches (to other converters) below it. Each higher-level converter is at a branch node, since below it there are (generally two, as shown above) branches to further converters. This terminology is not only appropriate for the binary hierarchical structure shown in FIG. 10b, but is also appropriate where there are multiple first-level converters underneath each second-level converter such as will be discussed with reference to FIG. 11, or even multiple second-level converters underneath each third-level converters, such as will be described with reference to FIGS. 14 and 14a.

Figure 12:
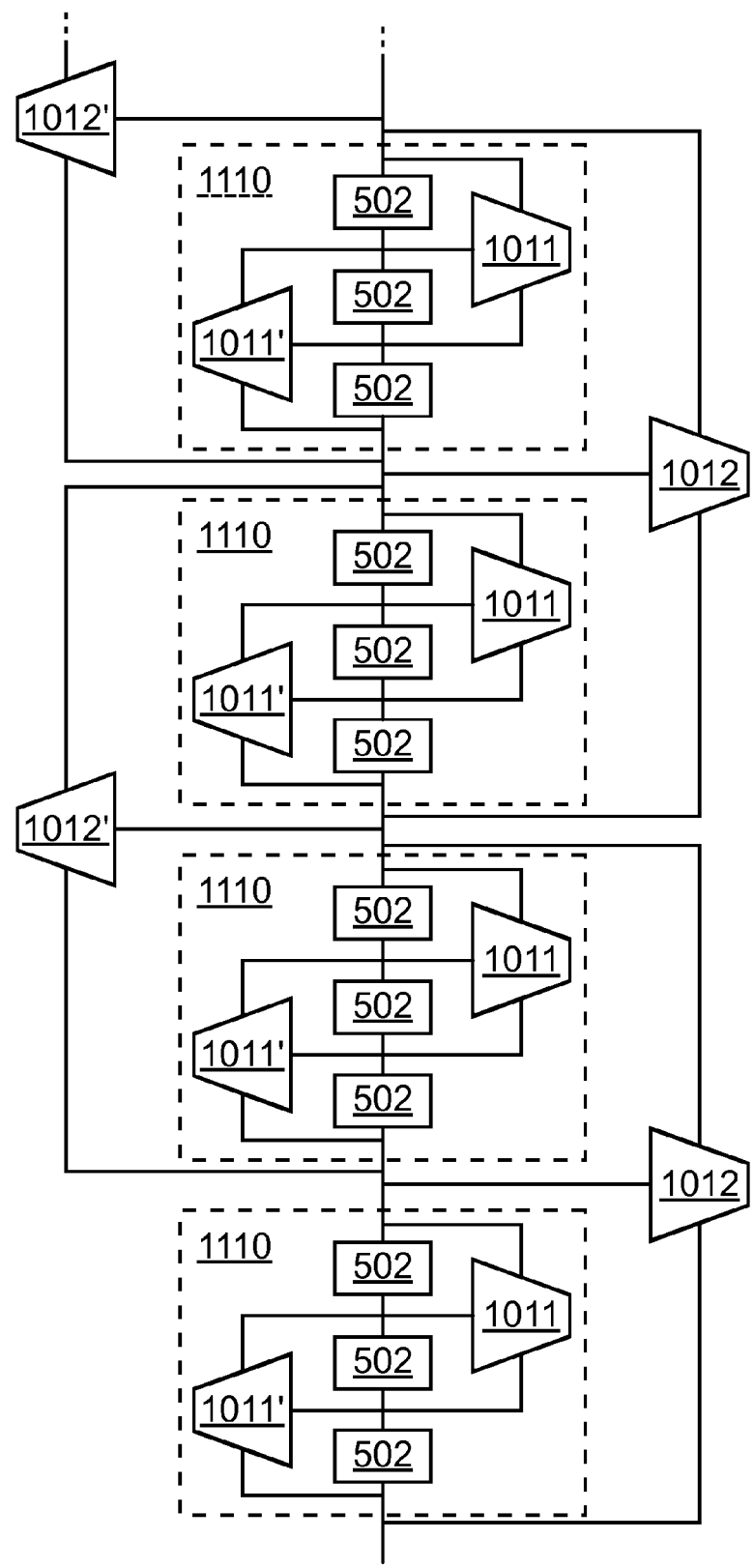
FIG. 12 shows a two-level hierarchical array of delta converters for connecting the same arrangements of panels and segments as in FIG. 11.

An alternative configuration for the same number of segments as that shown in figure in 11 is depicted in FIG. 12. As in FIG. 11, exchange between the three segments within each module 1110, is facilitated by means of 2 first-level delta converters, at 1011 and 1011'. Exchange between neighbouring modules is facilitated by a second-level delta converter 1012. However, in this embodiment, more second-level delta converters 1012 are used, in order to "daisy-chain" or "ripple" energy exchange between all of the modules, without resorting to high-level that delta converters. It will be immediately apparent, too, that the arrangement of FIG. 12 may be extended to an arbitrary number of modules (as illustrated by the dotted extensions at the top of the figure.) Extending this arrangement to 12 modules yields a two-level hierarchical arrangement, which may be directly compared to the arrangement of FIG. 5, wherein the individual segments are all daisy-chained in a non-hierarchical arrangement.

Figure 13:
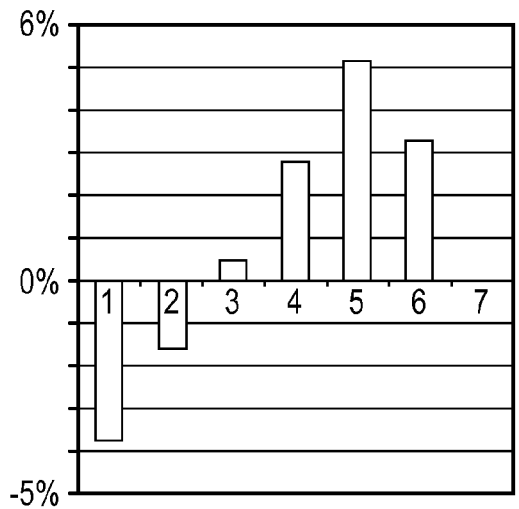
FIG. 13 is a graph of simulated relative output power increase by using delta converters for the arrangement of FIG. 12, when one module is in shadow.

Simulation results for such an extended arrangement are shown in FIG. 13, for the shaded module case, which is equivalent to that shown in FIG. 8. In this case, there is an improvement in power, relative to the no-delta-converter situation, for all shading levels other than very deep shade (100 W/m$^2$ or 200 W/m$^2$). Moreover, relative to the situation in FIG. 8, there is in all cases an improvement in efficiency. For instance with the panel in deep shadow (100 W/m$^2$), in the hierarchical case there is only a relative loss of some 3.8%, compared to over 13% with the non-hierarchical daisy-chained arrangement; with a partial shadow of 500 W/m$^2$ there is a power gain of over 5%, compared to a smaller power gain of just over 3% with the daisy-chained arrangement.

Figure 14:
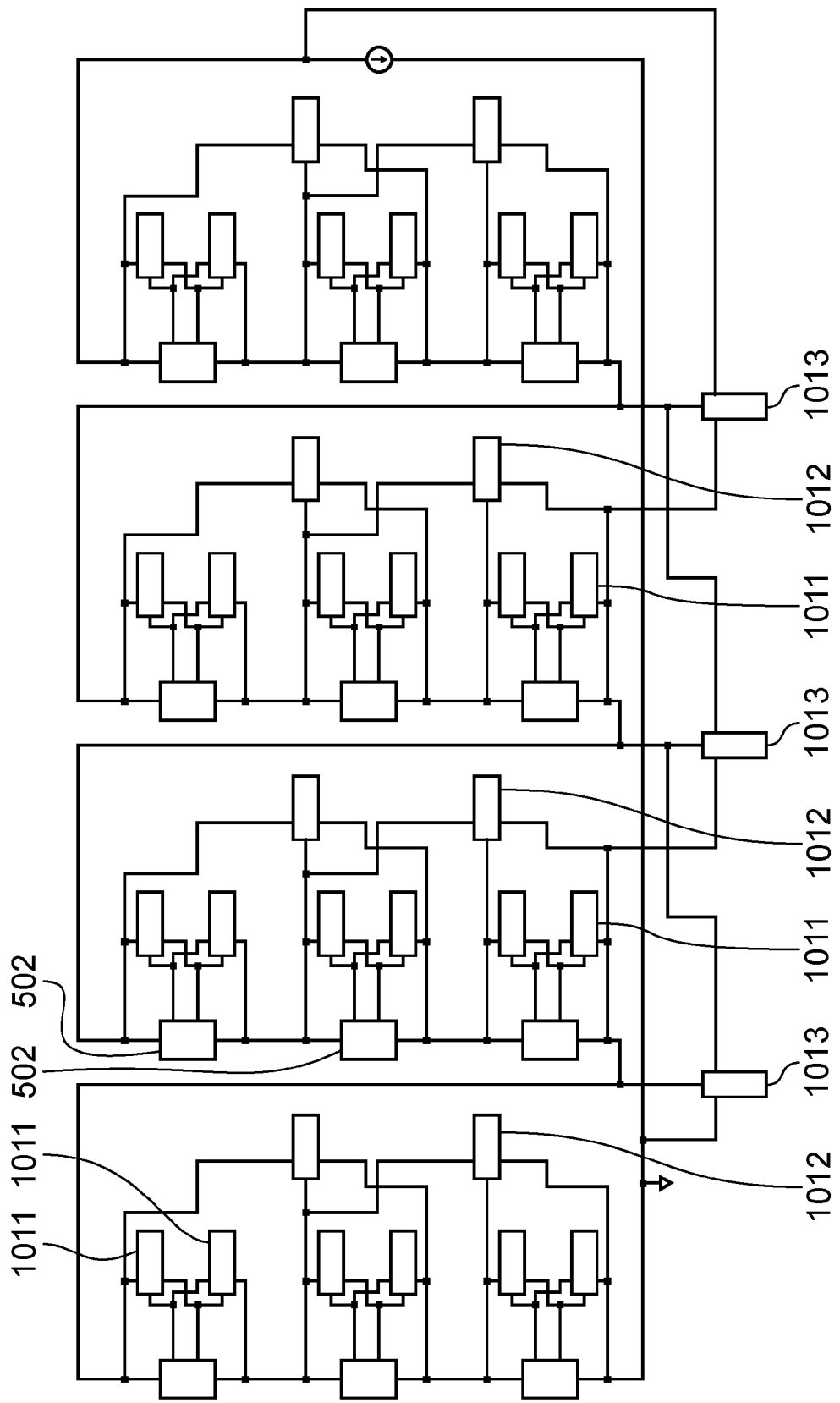
FIG. 14 is a schematic of a photovoltaic assembly, showing a hierarchical arrangement of delta converters arranged by segment and panel.
Figure 14A:
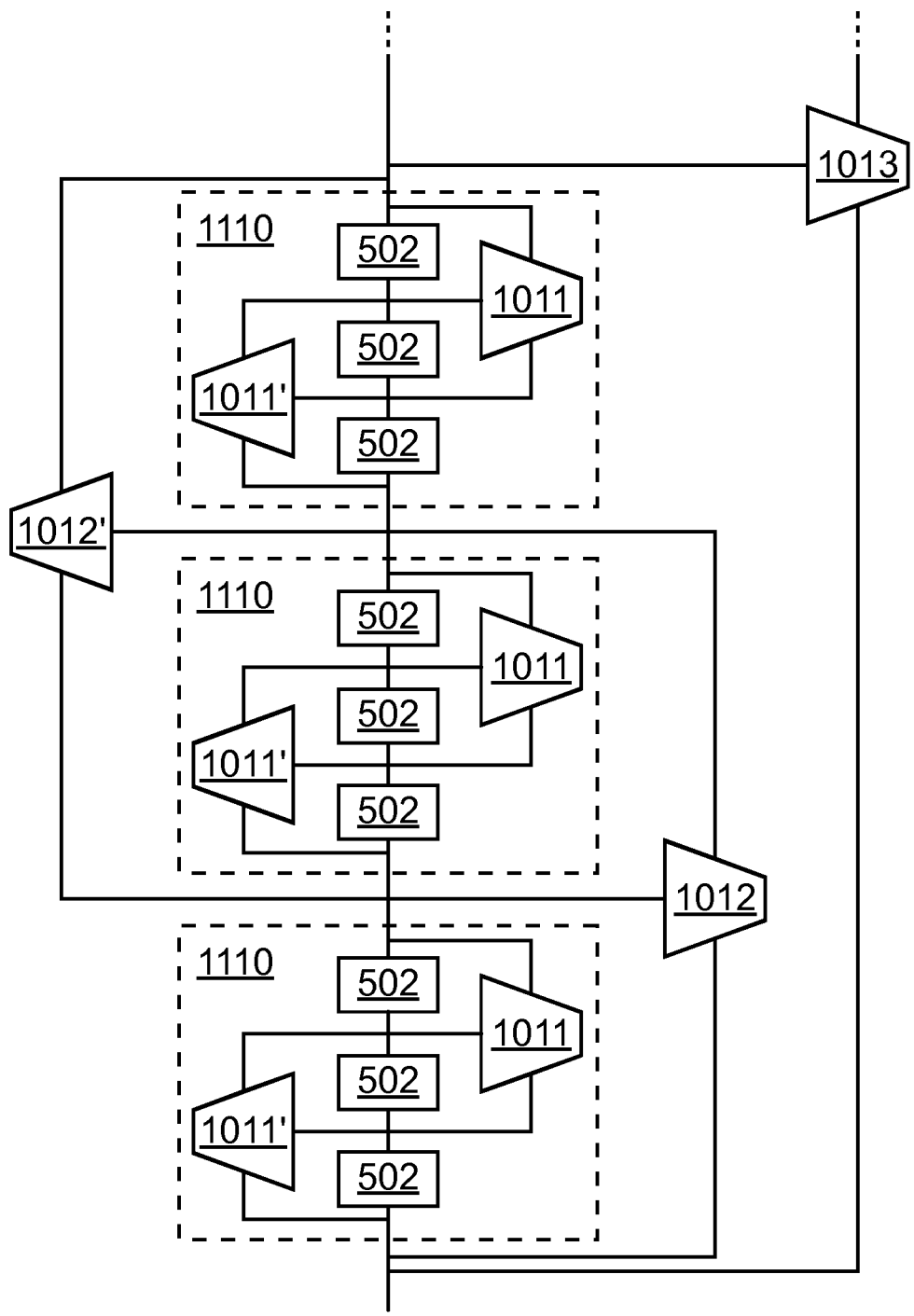
FIG. 14a is a schematic which shows the arrangement of one quarter of the assembly of FIG. 14, in more detail.

In the same way that a 2-level hierarchical arrangement can provide improvements over the non-hierarchical daisy-chained arrangement, in some circumstances arrangements with hierarchical 3 or more levels can yield yet more improvement. For example, the photovoltaic assembly shown in FIG. 5 could be conveniently wired into four groups of three panels or modules. The complete photovoltaic assembly, is shown in FIG. 14, and one quarter of the assembly is shown in more detail in FIG. 14a. In this arrangement, two first-level delta converters 1011 are provided to exchange energy within each module, and two second-level delta converters 1012 are used to exchange energy within a group of modules: between, in one case the lower and middle or modules within a group, and in the other case the middle and upper modules within the group; a third-level delta converter 1013 is used to exchange energy between that whole group and the neighbouring group. Thus in the quarter of the assembly shown in FIG. 14a there are in total six first-level, two second-level, and one third-level delta converters, making nine converters in total. This is replicated in the other three groups, with the exception that no third-level delta converter is required for the last group, making a grand total of 35 converters.

Figure 15:
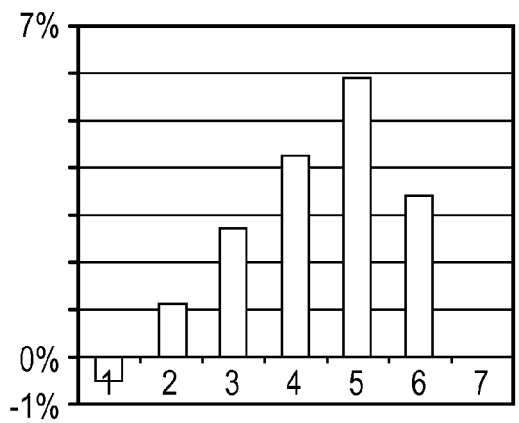
FIG. 15 is a graph of simulated relative output power increase by using delta converters in the arrangement of FIG. 14 when one complete module is in shadow.

The relative output power increase for this arrangement, under conditions that the bottom-left module is entirely shaded, is shown in FIG. 15. The figure is thus directly comparable with FIG. 13 for the case of a two-level hierarchical arrangements, and FIG. 8 for the case of a flat non-hierarchical arrangement. With this arrangement under these conditions, only when there is very deep shadow is there a loss relative to the operation without converters, and for all shading levels the relative power output increase is greater than for the non-hierarchical and two-level hierarchical arrangements.

Figure 16:
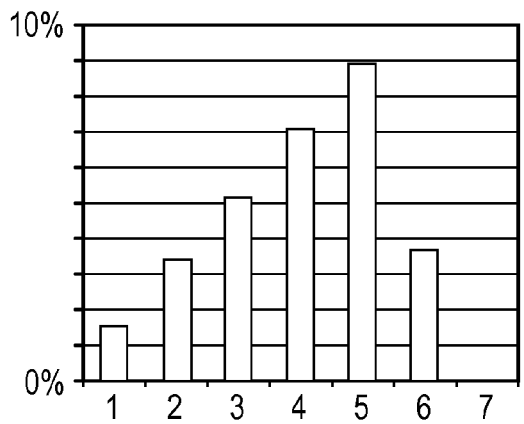
FIG. 16 is a graph of simulated relative output power increase using delta converters in the arrangement of FIG. 12 when the one horizontal strip of four segments is in shadow.

The relative power output power increase for this arrangement, under conditions that one horizontal strip of segments is shaded (the same as that depicted as "C" in FIG. 5), is shown in FIG. 16. This figure is thus comparable with that of FIG. 9 for the case of a flat non-hierarchical arrangement. With this arrangement and under these conditions, it is can be seen that there is a output power increase for all shading levels.

By virtue of many simulations, it has been established that under many different shading conditions, in cases where modules are partly shaded, that is to say some segments within the module are in shade and some are fully illuminated, equalisation on a segment-to-segment basis inside a module yields the best overall results.

It will be immediately apparent that adding additional hierarchy levels can reduce the number of converters that energy ripples through: the resulting gain can be traded against the increased wiring complexity of more hierarchical schemes. Practical implications of wiring schemes to support such hierarchical arrangements will now be considered. Firstly, it will be appreciated that photovoltaic assemblies are often manufactured and supplied in a modular fashion, at the level of individual solar panels or modules. It is convenient and commonplace to provide a junction box with, or integral to, each module (for instance as shown at 430 and 440 in FIG. 4). In the case that the solar module has three segments in series, two delta converters are included within the junction box for internal use within the module, and this may be generalised to a module having N series-connected segments, which then requires (N−1) level-1 delta converters within the junction box. Furthermore, each junction box can have an additional higher-level converter for energy exchange with a neighbouring module or another junction box.

Figure 17:
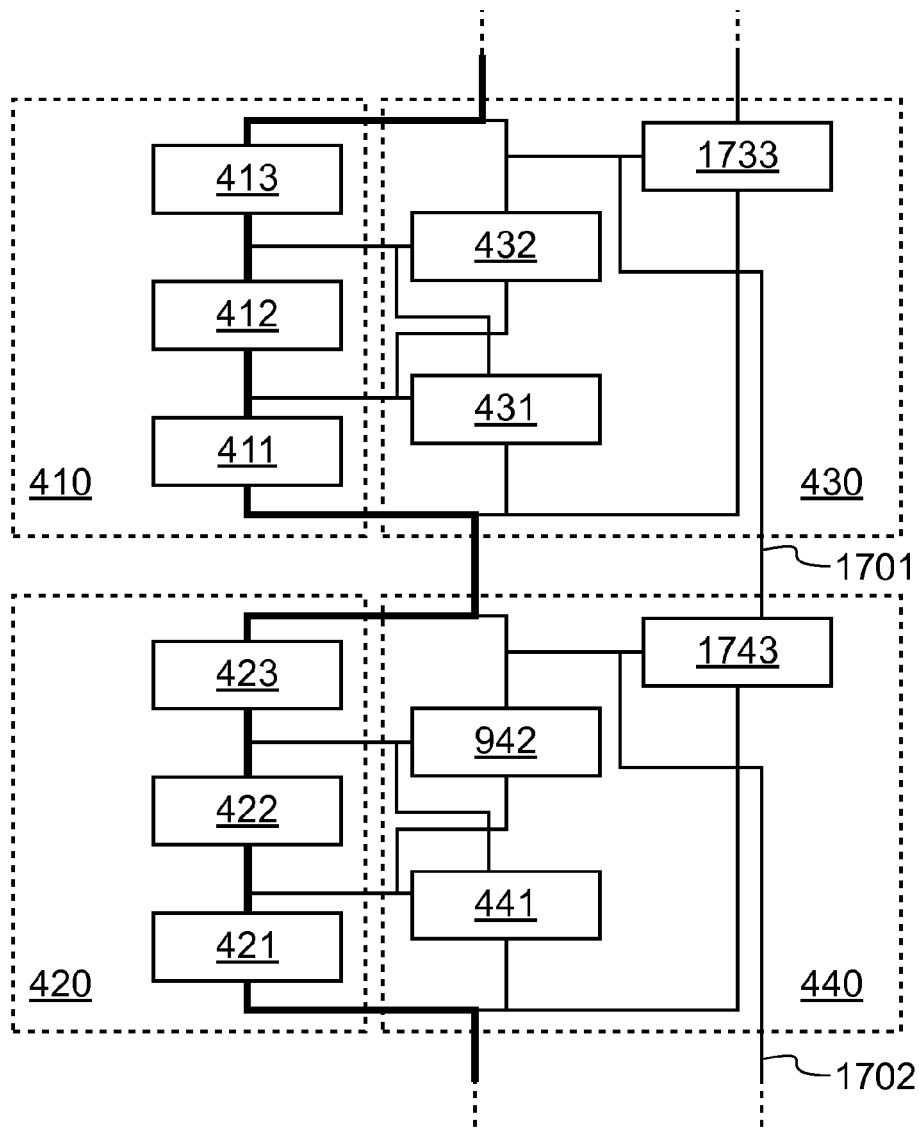
FIG. 17 shows an arrangement of converters for connecting two three-segment modules, including the wiring therebetween.
Figure 18:
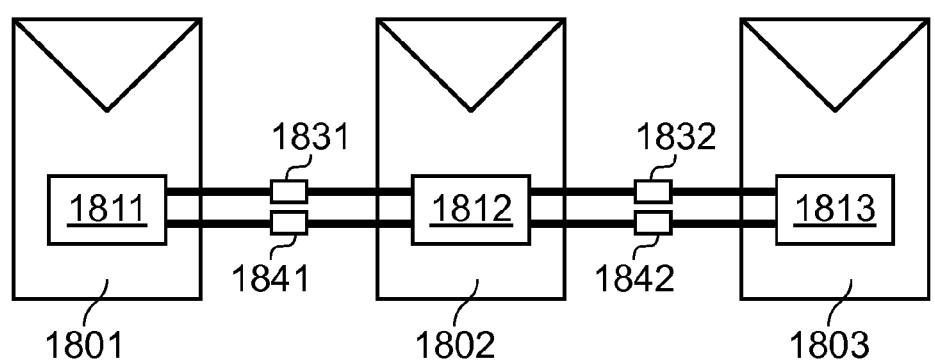
FIG. 18 shows schematically an assembly of three modules such as shown in FIG. 17.

This is shown schematically in FIG. 17, which shows two solar modules, 410 and 420 respectively, each with three series-connected segments, 411, 412 and 413, and 421, 422 and 423, respectively. Associated with each module is a respective junction box 430 and 440; junction box 430 includes two level-one delta converters 431 and 432, whereas junction box 440 includes two other level-one converters 441 and 442 respectively. The second junction box 440 also includes a higher level delta converter 1743, which exchanges energy with the first PV module 410. The first PV module's junction box 430 also includes a second level delta converter 1733, for onwards energy exchange with a further solar module. As in the case with a flat non-hierarchical arrangement, one additional wire 1701 needs to be routed from one module to the other. For the top solar module in the string, the level-two delta converter may simply not be used. Thus a typical, midstream junction box will have four wives connected, two on each side. This is illustrated in FIG. 18 which shows a series arrangement of three modules, 1801, 1802 and 1803. Each module has an associated junction box 1811, 1812, and 1813 respectively. Connecting end module 1801 to middle module 1802 are connectors 1831 and 1841, and connecting middle module 1802 and end module 1803 are two further collectors 1832 and 1842. Thus middle module 1802 has in total four connections: one input and one output for the main the primary current flow, and one input and one output for the supplementary current provided by the energy exchange units (corresponding to the wire connections 1701 and 1702 in FIG. 17).

Figures 19A, 19B:
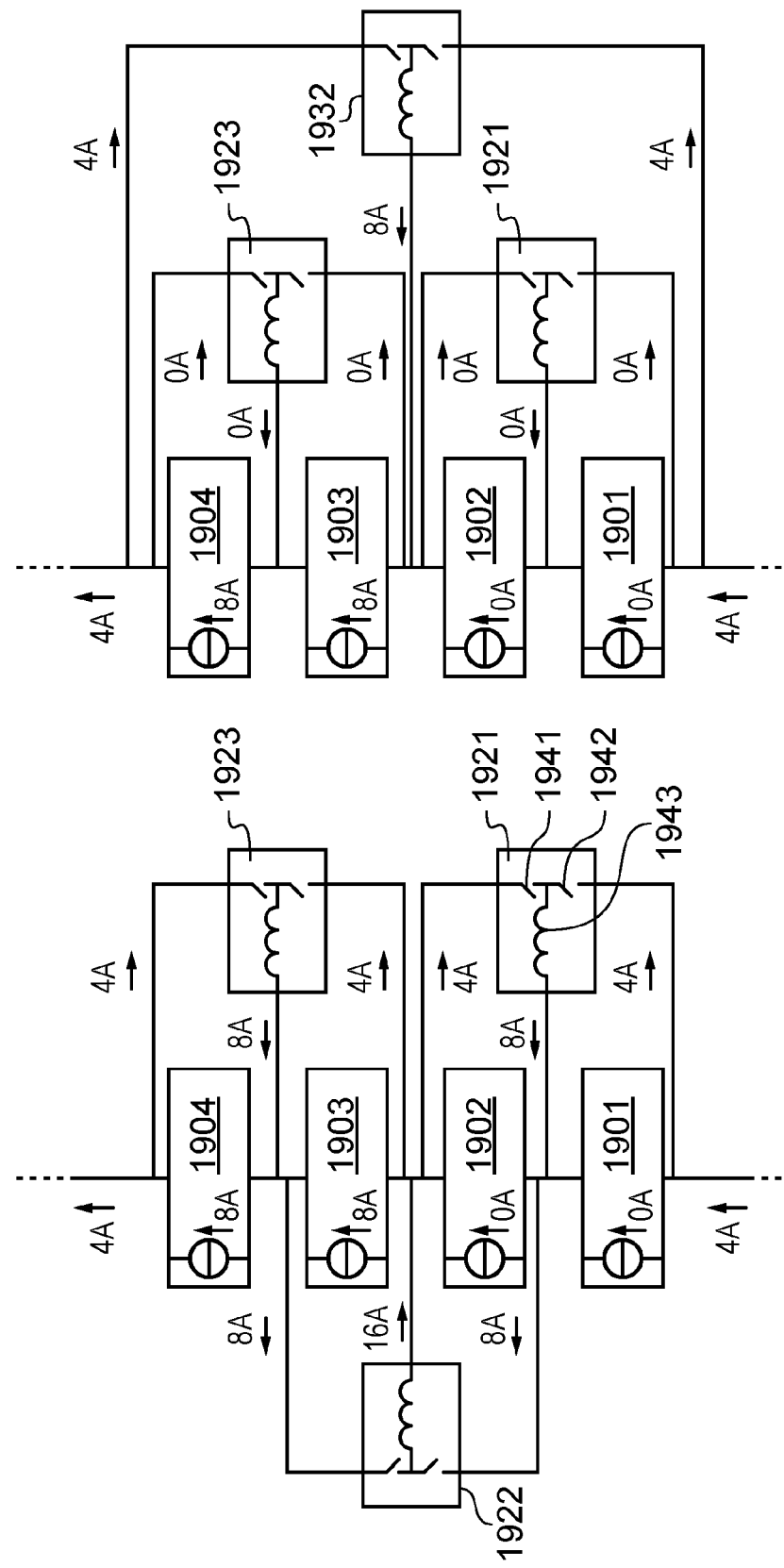
FIG. 19 is a schematic showing of the relative currents through the delta converters for a series arrangement of four segments: at FIG. 19a with the delta converters arranged non-hierarchically; and at figure at 19b with the converters arranged in a two-level hierarchy.

Current and voltage dimensioning of the converters in a hierarchical arrangement, in comparison to a non-hierarchical arrangement, will now be considered with reference to FIG. 19. The figure shows a string of 4 series-connected segments, 1901, 1902, 1903 and 1904, with two arrangements of converters. The use of a flat non-hierarchical level is shown in FIG. 19a with three delta converters 1921, 1922, and 1923, where converter 1921 exchanges current between segments in 1901 and 1902, and so on; the use of two hierarchy levels is shown in FIG. 17b, with two first-level converters, one (1921) providing exchange between segments 1901 and 1902, and the other (1923) providing exchange between segments 1903 and 1904, together with a single second-level converter 1932 connecting the two groups of segments. In the illustrated case, the top two segments are fully illuminated, yielding an insolation current of 8 A in each segment. The bottom two segments are fully shaded, yielding an insolation current of 0 A. Due to the applied voltage equalization scheme, the resulting string current in both cases will be 4 A. In the non-hierarchical case, all the delta converters will be in down-conversion mode. The DC current levels at each terminal have been indicated in the figure: The bottom and top delta converters draw on average 4 A DC current at each of the input terminals (actually 8 A current, neglecting current ripple, during 50% of the time, with current flowing into the top terminal during the first half of the switching period, and current flowing into the bottom terminal during the second half of the period; the switches 1941 and 1942 of the half bridge and the coil 1943 have been indicated inside the delta converters to illustrate this) and 8 A DC current at the output terminals. The middle converter has to deliver twice the current at each terminal, since it has to deliver current to both of the shaded segments at the bottom of the string. In contrast, for hierarchical arrangement of FIG. 19b only the level-2 delta converter will be active, drawing 4 A DC current at its input terminals and delivering 8 A at its output terminals. In terms of voltages, the voltages across the switches in the down converters when not conducting will be that of two segments in series in FIG. 19a and four segments in series for the active level-2 delta converter in FIG. 19b.

It should be noted that in this analysis, the difference between insolation current, which is almost equal to the short-circuit current, and the operating current, typically at near to the maximum-power point, has been neglected. This difference is dependant on the diode current, and thus varies between different solar cells technologies (such as single-crystal silicon, poly-crystalline silicon, thin film technologies such as CIGS, etc.). For any given technology, though, the difference is—relatively—uniform between solar cells, and thus insolation current can appropriately be used as a proxy for operating current.

Comparing the middle delta converter in FIG. 19a with the level-2 delta converter in FIG. 19b, the current levels through the switches are double and the voltage rating of the switches is half. Assuming the same switch silicon area, the resistance of the switches for the level-2 delta converter in FIG. 19b will be 4 times that of the converters in FIG. 19a. The reason is that when the breakdown voltage doubles, the length of the transistor doubles. Keeping the same area, the width needs to be halved and therefore the resistance becomes 4 times larger. At the same time, the current levels in the switches in the level-2 converter in FIG. 19b are halved. Therefore, the ohmic losses in the switches in the level-2 converter in FIG. 19b are the same as the ohmic losses in the middle delta converter in FIG. 19a, since ohmic losses are defined by $I^2R$. This implies that although higher voltage rating is needed for the switches in FIG. 19b, the efficiency can be made the same as the converters in FIG. 19a at the same silicon cost.

As described above with respect to FIG. 19a, the current carrying requirement of converters in rippling energy from fully illuminated segments to partially illuminated segments can increase with an increased length of string (8 A and 16 A in that case). Thus, it can readily be shown, that for a non-hierarchical arrangement with 12 segments, the bottom six of which are fully shaded and the top six of which are illuminated and produce a current of 8 amps, successive converter starting from the top of the string must be able to handle currents of 8, 16, 24, 32 and 40 amps respectively. Such high current carrying capability requirement is avoided or alleviated by the use of hierarchical arrangements.

In the example of FIG. 19, the benefits of moving to the hierarchical case can be clearly seen. In FIG. 19a, 3 delta converters are active, whereas in FIG. 19b only one delta converter is active. Since the energy to be regained is the same in both FIG. 19a and FIG. 19b, the output power will be higher in FIG. 19b.

In terms of dimensioning delta converters in practical systems, a similar line of reasoning as applied to FIG. 17 can be applied. After choosing the hierarchy scheme, i.e. the number of hierarchy levels and the size of the groups in each hierarchy level, the maximum currents in each converter under worst case shading conditions can be identified and the converters can be dimensioned accordingly.

It should be noted that, by using a hierarchical arrangements according to embodiments of the invention, it is also possible to introduce a degree of redundancy: for instance the middle first-level converter 1922 of FIG. 19 could be included in the hierarchical arrangement of FIG. 19b. Although in some circumstances it is possible that this may provide some benefits in terms of requiring lower power rating for individual converters, it can be shown that the increased complexity of control and cost of components normally outweighs the benefits such that use of more than N−1 converters for an arrangement of N segments is not a preferred embodiment.

From one viewpoint, then, a photovoltaic assembly is disclosed which comprises a string formed from a plurality of series-connected photovoltaic generators, and a hierarchical structure of power-exchange units, which each exchange power between neighbouring photovoltaic generators or groups of photovoltaic generators.

The photovoltaic generators may be individual solar cells or a plurality of series-connected solar cells arranged as a segment. To compensate for differences in output between segments for instance due to partial shading, power-exchange units, such as DC-DC converters, are arranged across neighbouring segments, such that each power-exchange unit effectively sources or sinks current between neighbouring segments to current-match the string. To avoid unnecessary "rippling" of power matching along many power-exchange units and the associated power loss due to many power-exchange units operating at less than 100% efficiency, the power-exchange units are arranged in a hierarchical structure.

A method of operating such a photovoltaic assembly is also disclosed.

From reading the present disclosure, other variations and modifications will be apparent to the skilled person. Such variations and modifications may involve equivalent and other features which are already known in the art of photovoltaic assemblies, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A photovoltaic assembly comprising a plurality of sub-assemblies arranged as a hierarchical tree structure,
   each sub-assembly comprising
      two series-connected photovoltaic generators; and
      a first-level delta converter connected across the two series-connected photovoltaic generators and configured to facilitate energy exchange between the two series-connected photovoltaic generators;
      two second-level delta converters, each second-level delta converter configured to facilitate energy exchange between a pair of sub-assemblies; and
      a third-level delta converter configured to facilitate energy exchange between two pairs of sub-assemblies,
      wherein each delta converter comprises two series-connected switches having a half-bridge node therebetween and an inductor connected to the half-bridge node.

2. A photovoltaic assembly as claimed in claim 1, wherein each photovoltaic generator comprises a plurality of series-connected solar cells.

3. A photovoltaic assembly as claimed in claim 1, wherein the first-level delta converter is configured to at least one of source current to and sink current from a node between the photovoltaic generators.

4. A photovoltaic assembly as claimed in claim 1, wherein the first-level delta converter is configured to maintain a control voltage within a voltage window centred one half of a voltage across the photovoltaic generators.

5. A photovoltaic assembly as claimed in claim 4, wherein the first-level delta converter is configured to be operable only when the control voltage is not within said voltage window.

6. A photovoltaic assembly as claimed in claim 4, wherein the control voltage is a voltage at a node between the photovoltaic generators, off-set by a voltage which is dependent on the current through the node.

7. A method of operating a photovoltaic assembly comprising a plurality of sub-assemblies arranged as a hierarchical tree structure, the method including
   using a first-level delta converter to facilitate energy exchange between two series-connected photovoltaic generators of each sub-assembly;
   using two second-level delta converters to facilitate energy exchange between a pair of sub-assemblies; and
   using a third-level delta converter to facilitate energy exchange between two pairs of sub-assemblies,
wherein each photovoltaic generator comprises a solar cell or a plurality of series-connected solar cells, wherein each delta converter comprises two series-connected switches having a half-bridge node therebetween and an inductor connected to the half-bridge node.

* * * * *